(12) United States Patent
Hwang et al.

(10) Patent No.: US 6,556,163 B2
(45) Date of Patent: Apr. 29, 2003

(54) ANALOG TO DIGITAL CONVERSION DEVICE

(75) Inventors: Jyh-Guo Hwang, Hsinchu (TW); Yia-Min Jue, Yung-Kang (TW); Hao-Ping Lee, Hsinchu (TW)

(73) Assignee: Elen Microelectronics Corp., Hsinchu (TW)

( * ) Notice: Subject to any disclaimer, the term of this patent is extended or adjusted under 35 U.S.C. 154(b) by 0 days.

(21) Appl. No.: 10/122,896

(22) Filed: Apr. 11, 2002

(65) Prior Publication Data

US 2002/0149504 A1 Oct. 17, 2002

(30) Foreign Application Priority Data

Apr. 13, 2001  (TW) ...................................... 90205852 U

(51) Int. Cl.$^7$ ................................................ H03M 1/12
(52) U.S. Cl. ...................................... 341/155; 341/139
(58) Field of Search .............................. 341/155, 122, 341/139, 120, 156, 172

(56) References Cited

U.S. PATENT DOCUMENTS 6,300,889 B1 * 10/2001 Piasecki ...................... 341/155
6,489,904 B1 * 12/2002 Hisano ........................ 341/155

* cited by examiner

Primary Examiner—Brian Young
(74) Attorney, Agent, or Firm—J.C. Patents

(57) ABSTRACT

An analog to digital conversion device integrated in a microcontroller that is accomplished on a single chip, the device comprising: an adjustable gain amplifier, used to obtain a corresponding analog voltage signal V1—V2 after corresponding an input analog voltage V1 to a reference voltage V2, and based on a corresponding relationship of a gain function A, performing an amplification operation to a corresponding analog voltage signal, and further outputting an amplified analog voltage signal A(V1−V2); and a n-bit analog to digital converter, having a reference voltage Vr, electrically coupling to an output of the adjustable gain amplifier, used to convert the amplified analog voltage signal into a digital voltage signal, and outputting the digital voltage signal, wherein the gain function of the adjustable gain amplifier can be provided to the microcontroller to perform an adjustment according to the reference voltage Vr and a relationship of a peak value of the input corresponding analog voltage signal, further obtaining a better digital signal resolution.

14 Claims, 7 Drawing Sheets

ANALOG TO DIGITAL CONVERSION DEVICE

CROSS-REFERENCE TO RELATED APPLICATION

This application claims the priority benefit of Taiwan application Ser. No. 90205852, filed Apr. 13, 2001.

BACKGROUND OF THE INVENTION

1. Field of Invention

The present invention generally relates to an analog to digital conversion device, and more particularly, to an analog to digital conversion device integrated in a microcontroller that is accomplished on a single chip.

2. Description of Related Art

The analog to digital converter is widely used in current digital circuits. Most microcontrollers have an analog to digital converter to perform the analog to digital conversion operation. FIG. 1 schematically shows a functional block sketch map of a conventional microcontroller 10 that is accomplished on a single chip and comprises an analog to digital converter 101. The specification of the general analog to digital converter comprises a reference voltage and a bit number of the output digital signal. In order to describe clearly, the analog to digital converter 101 is exemplified hereinafter as the 8-bit analog to digital converter having the reference voltage 5 V, that means the acceptable range of the input analog signal is 5 V, and the output digital signal is 8 bits, so the resolution of the analog to digital converter is 5 V/255 (i.e. $2^8-1$)=19.6 mV. Therefore, under normal circumstances, the 8-bit analog to digital converter is suitable for converting the analog signal having the voltage intensity from 0 V to 5 V into a digital signal of 0 to 255 and outputs it. However, because of the variance of the application fields, there exists a big variance in the voltage intensity of the input analog signal. For example, if the input analog signal is 75+75 sin(wt) mV, that is, a sine analog signal having a peak value of only 150 mV, the maximum value of the digital signal output from the analog to digital converter mentioned above is 8(150/19.6=7.653), further resulting in the defect of poor total utilization (9/256) and resolution caused by the signal intensity being too small.

In consideration of the cost, it is not feasible to increase the bit number of the analog to digital converter. Moreover, the conversion time needed for the analog to digital converter having a larger bit number is also increased, and it also demands a larger amount of the operation current for its work. Based on the factors mentioned above, how to solve the defects in the prior art mentioned above without having to increase the physical bit number is the major objective of the present invention.

SUMMARY OF THE INVENTION

The present invention provides an analog to digital conversion device integrated in a microcontroller that is accomplished on a single chip, the device comprising: an adjustable gain amplifier, used to obtain a corresponding analog voltage signal V1−V2 after corresponding an input analog voltage V1 to a reference voltage V2, and based on a corresponding relationship of a gain function A, performing an amplification operation to a corresponding analog voltage signal, and further outputting an amplified analog voltage signal A(V1−V2); and a n-bit analog to digital converter, having a reference voltage Vr, electrically coupling to an output of the adjustable gain amplifier, used to convert the amplified analog voltage signal into a digital voltage signal, and outputting the digital voltage signal, wherein the gain function of the adjustable gain amplifier can be provided to the microcontroller to perform an adjustment according to the reference voltage Vr and a relationship of a peak value of the corresponding input analog voltage signal, further obtaining a better digital signal resolution.

According to the concepts mentioned above, the adjustable gain amplifier in the analog to digital conversion device comprises an operational amplifier, a fixed resistor R1, and a variable resistor R2, wherein the operational amplifier has an inverse phase input terminal, a non-inverse phase input terminal, and an output terminal. The analog voltage signal V1 inputs into the non-inverse phase input terminal, and the output terminal couples to the n-bit analog to digital converter. The fixed resistor R1 electrically couples in between the ground where the reference voltage V2 equals 0 and the inverse phase input terminal. The variable resistor R2 that is electrically coupled in between the inverse phase input terminal and the output terminal is used to create the adjustable gain amplifier having a gain function A as (R1+R2)/R1.

According to the concepts mentioned above, the adjustable gain amplifier in the analog to digital conversion device comprises an operational amplifier, a fixed resistor R1, and a variable resistor R2, wherein the operational amplifier has an inverse phase input terminal, a non-inverse phase input terminal, and an output terminal. The analog voltage signal V1 inputs into the non-inverse phase input terminal, and the output terminal couples to the n-bit analog to digital converter. The fixed resistor R1 electrically couples in between the reference voltage V2 and the inverse phase input terminal. The variable resistor R2 that is electrically coupled in between the inverse phase input terminal and the output terminal is used to create the adjustable gain amplifier having a gain function A as (R1+R2)/R1 that corresponds to the reference voltage V2.

According to the concepts mentioned above, the adjustable gain amplifier in the analog to digital conversion device comprises an operational amplifier, a load resistor RL, a npn transistor, a fixed resistor R1, and a variable resistor R2. Wherein the operational amplifier has an inverse phase input terminal, a non-inverse phase input terminal, and an output terminal. The analog voltage signal V1 inputs into the inverse phase input terminal, the reference voltage V2 inputs into the non-inverse phase input terminal. The load resistor RL electrically couples in between the analog voltage signal V1 and the inverse phase input terminal. The npn transistor has a collector, an emitter, and a base. The collector of the npn transistor couples to the inverse phase input terminal, the emitter of the npn transistor couples to the output terminal, and the base of the npn transistor couples to the non-inverse phase input terminal. The fixed resistor R1 electrically couples to the non-inverse phase input terminal. The variable resistor R2 that is electrically coupled in between the output terminal and the fixed resistor R1 is used to create the adjustable gain amplifier having a logarithmic gain function A as (R1+R2)/R1 that corresponds to the reference voltage V2.

The other aspect of the present invention is an analog to digital conversion device that is integrated in a microcontroller, the device comprising: an adjustable gain amplifier, used to obtain a corresponding analog voltage signal V1−V2 after corresponding an input analog voltage V1 to a reference voltage V2, and based on a corresponding relationship of a gain function A, performing an amplification operation to a corresponding analog voltage signal, and further outputting an amplified analog voltage signal A(V1−V2); and a n-bit analog to digital converter, having a reference voltage Vr, electrically coupling to an output of the adjustable gain amplifier, used to convert the amplified analog voltage signal into a digital voltage signal, and outputting the digital voltage signal, wherein the gain function of the adjustable gain amplifier can be provided to the microcontroller to perform an adjustment according to the reference voltage Vr and a relationship of a peak value of the corresponding input analog voltage signal, further obtaining a better digital signal resolution.

According to the concepts mentioned above, all elements of the microcontroller in the analog to digital device are accomplished on a single chip.

According to the concepts mentioned above, the adjustable gain amplifier in the analog to digital conversion device comprises an operational amplifier, a fixed resistor R1, and a variable resistor R2, wherein the operational amplifier has an inverse phase input terminal, a non-inverse phase input terminal, and an output terminal. The analog voltage signal V1 inputs into the non-inverse phase input terminal, and the output terminal couples to the n-bit analog to digital converter. The fixed resistor R1 electrically couples in between the ground where the reference voltage V2 equals 0 and the inverse phase input terminal. The variable resistor R2 that is electrically coupled in between the inverse phase input terminal and the output terminal is used to create the adjustable gain amplifier having a gain function A as (R1+R2)/R1.

According to the concepts mentioned above, the adjustable gain amplifier in the analog to digital conversion device comprises an operational amplifier, a fixed resistor R1, and a variable resistor R2, wherein the operational amplifier has an inverse phase input terminal, a non-inverse phase input terminal, and an output terminal. The analog voltage signal V1 inputs into the non-inverse phase input terminal, and the output terminal couples to the n-bit analog to digital converter. The fixed resistor R1 electrically couples in between the reference voltage V2 and the inverse phase input terminal. The variable resistor R2 that is electrically coupled in between the inverse phase input terminal and the output terminal is used to create the adjustable gain amplifier having a gain function A as (R1+R2)/R1 that corresponds to the reference voltage V2.

According to the concepts mentioned above, the adjustable gain amplifier in the analog to digital conversion device comprises an operational amplifier, a load resistor RL, a npn transistor, a fixed resistor R1, and a variable resistor R2, wherein the operational amplifier has an inverse phase input terminal, a non-inverse phase input terminal, and an output terminal. The analog voltage signal V1 inputs into the inverse phase input terminal, and the reference voltage V2 inputs into the non-inverse phase input terminal. The load resistor RL electrically couples in between the analog voltage signal V1 and the inverse phase input terminal. The npn transistor has a collector, an emitter, and a base. The collector of the npn transistor couples to the inverse phase input terminal, the emitter of the npn transistor couples to the output terminal, and the base of the npn transistor couples to the non-inverse phase input terminal. The fixed resistor R1 electrically couples to the non-inverse phase input terminal. The variable resistor R2 that is electrically coupled in between the output terminal and the fixed resistor R1 is used to create the adjustable gain amplifier having a logarithmic gain function A as (R1+R2)/R1 that corresponds to the reference voltage V2.

The other aspect of the present invention is an analog to digital conversion device, the device comprising: an adjustable gain amplifier, used to obtain a corresponding analog voltage signal V1−V2 after corresponding an input analog voltage V1 to a reference voltage V2, and based on a corresponding relationship of a gain function A, performing an amplification operation to a corresponding analog voltage signal, and further outputting an amplified analog voltage signal A(V1−V2); and a n-bit analog to digital converter, having a reference voltage Vr, electrically coupling to an output of the adjustable gain amplifier, used to convert the amplified analog voltage signal into a digital voltage signal, and outputting the digital voltage signal, wherein the gain function of the adjustable gain amplifier can be provided to the microcontroller to perform an adjustment according to the reference voltage Vr and a relationship of a peak value of the corresponding input analog voltage signal, further obtaining a better digital signal resolution.

According to the concepts mentioned above, the analog to digital conversion device is integrated in a microcontroller, and the microcontroller is accomplished on a single chip.

According to the concepts mentioned above, the adjustable gain amplifier in the analog to digital conversion device comprises an operational amplifier, a fixed resistor R1, and a variable resistor R2, wherein the operational amplifier has an inverse phase input terminal, a non-inverse phase input terminal, and an output terminal. The analog voltage signal V1 inputs into the non-inverse phase input terminal, and the output terminal couples to the n-bit analog to digital converter. The fixed resistor R1 electrically couples in between the ground where the reference voltage V2 equals 0 and the inverse phase input terminal. The variable resistor R2 that is electrically coupled in between the inverse phase input terminal and the output terminal is used to create the adjustable gain amplifier having a gain function A as (R1+R2)/R1.

According to the concepts mentioned above, the adjustable gain amplifier in the analog to digital conversion device comprises an operational amplifier, a fixed resistor R1, and a variable resistor R2. Wherein the operational amplifier has an inverse phase input terminal, a non-inverse phase input terminal, and an output terminal. The analog voltage signal V1 inputs into the non-inverse phase input terminal, and the output terminal couples to the n-bit analog to digital converter. The fixed resistor R1 electrically couples in between the reference voltage V2 and the inverse phase input terminal. The variable resistor R2 that is electrically coupled in between the inverse phase input terminal and the output terminal is used to create the adjustable gain amplifier having a gain function A as (R1+R2)/R1 that corresponds to the reference voltage V2.

According to the concepts mentioned above, the adjustable gain amplifier in the analog to digital conversion device comprises an operational amplifier, a load resistor RL, a npn transistor, a fixed resistor R1, and a variable resistor R2. The operational amplifier has an inverse phase input terminal, a non-inverse phase input terminal, and an output terminal. The analog voltage signal V1 inputs into the inverse phase input terminal, and the reference voltage V2 inputs into the non-inverse phase input terminal. The load resistor RL electrically couples in between the analog voltage signal V1 and the inverse phase input terminal. The npn transistor has a collector, an emitter, and a base. The collector of the npn transistor couples to the inverse phase input terminal, the emitter of the npn transistor couples to the output terminal, and the base of the npn transistor couples to the non-inverse phase input terminal. The fixed resistor R1 electrically couples to the non-inverse phase input terminal. The variable resistor R2 that is electrically coupled in between the output terminal and the fixed resistor R1 is used to create the adjustable gain amplifier having a logarithmic gain function A as (R1+R2)/R1 that corresponds to the reference voltage V2.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a functional block sketch map of a conventional microcontroller that is accomplished on a single chip and comprises an analog to digital converter.

DESCRIPTION OF THE PREFERRED EMBODIMENTS

Figure 1:
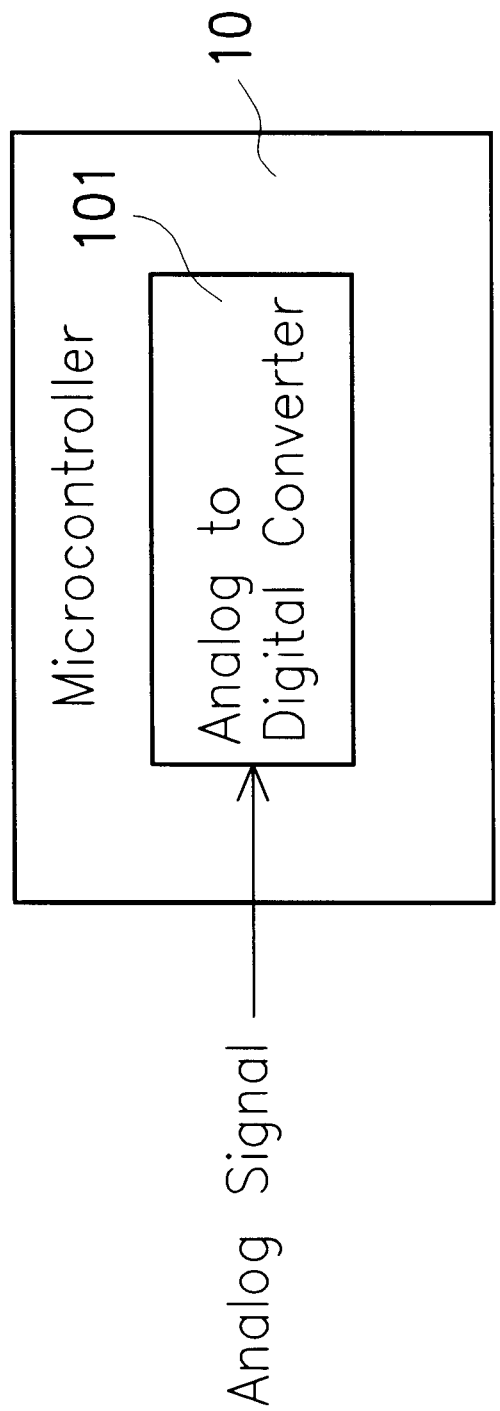
Figure 2:
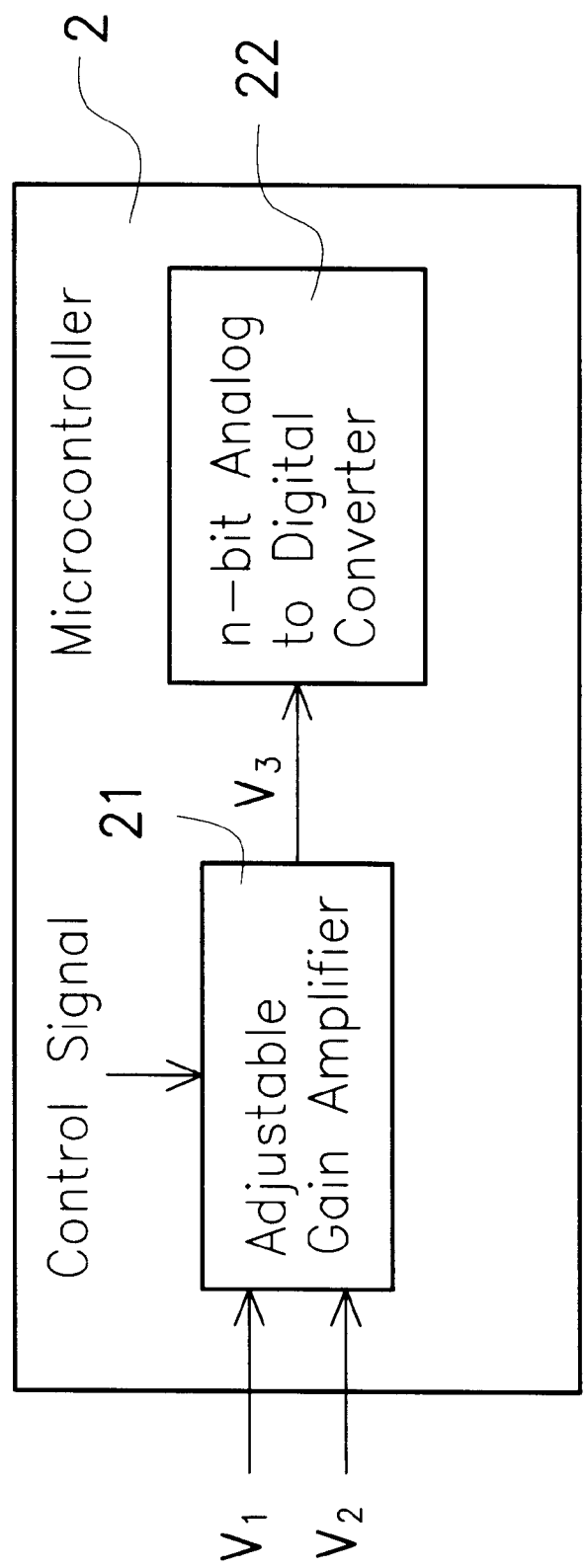
FIG. 2 schematically shows a block diagram of the analog to digital conversion device of the embodiment developed to solve the defects in the prior art according to the present invention.

Please refer to FIG. 2, it schematically shows a block diagram of the analog to digital conversion device of the embodiment developed to solve the defects in the prior art according to the present invention. The device is mostly composed of an adjustable gain amplifier 21 and an n-bit analog to digital converter 22. The elements mentioned above are integrated on a microcontroller 2, and the microcontroller 2 is accomplished in a single chip.

Figure 3:
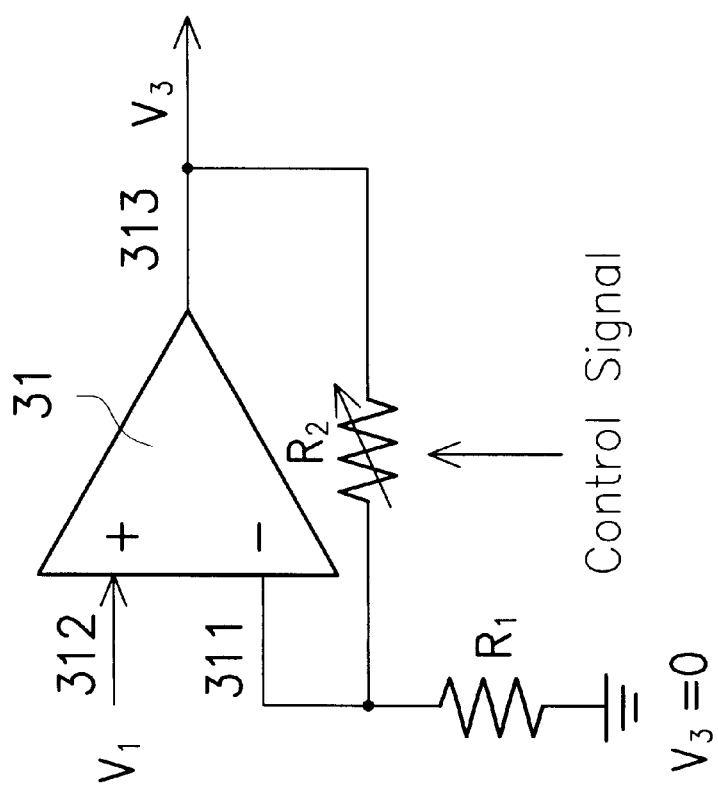
FIG. 3 schematically shows a circuit sketch map of the first preferred embodiment among the various embodiments developed for different requirements of the adjustable gain amplifier according to the present invention.

The adjustable gain amplifier mentioned above is mostly used to obtain a corresponding analog voltage signal V1-V2 after corresponding an input analog voltage V1 to a reference voltage V2, and based on a corresponding relationship of a gain function A to perform an amplification operation to a corresponding analog voltage signal, and further to output an amplified analog voltage signal A(V1-V2), wherein the magnitude of the gain function A can be adjusted via a control signal. The n-bit analog to digital converter 22 having a reference voltage Vr is used to convert the amplified analog voltage signal into a digital voltage signal and to output the digital voltage signal. The present invention is wherein the gain function of the adjustable gain amplifier can be provided to the microcontroller to perform an adjustment according to the reference voltage Vr and a relationship of a peak value of the corresponding input analog voltage signal, further to obtain a better digital signal resolution. FIG. 3 schematically shows a first preferred embodiment among the various embodiments developed for different requirements of the adjustable gain amplifier 21. The adjustable gain amplifier 21 comprises an operational amplifier 31, a fixed resistor R1, and a variable resistor R2. Wherein, the operational amplifier 31 has an inverse phase input terminal 311, a non-inverse phase input terminal 312, and an output terminal 313. The analog voltage signal V1 mentioned above inputs into the non-inverse input terminal 312, and the output terminal 313 couples to the n-bit analog to digital converter 22. The fixed resistor R1 couples in between the ground where the reference voltage V2 equals 0 and the inverse phase input terminal 311. The variable resistor R2 couples in between the inverse phase input terminal 311 and the output terminal 313. According to the circuit characteristic of the operational amplifier, an adjustable gain amplifier having a gain function A as (R1+R2)/R1 can be obtained, thus the amplified analog voltage signal V3 output from the output terminal 313 equals A(V1-V2), and since A=(R1+R2)/R1, thus V3=(R1+R2)V1/R1.

In order to have a better understanding of the invention, the same example exemplified in the description of the related art section is used hereinafter for description again. That is, the n-bit analog to digital converter 22 is defined as the 8-bit analog to digital converter having the reference voltage Vr=5 V. Moreover, when an analog voltage V1 that equals 75+75 sin(wt) mV is input, that means a sine analog signal having a peak value not greater than 150 mV is input. Therefore, the microcontroller can adjust the resistor value of the variable resistor R2 via the control signal according to the magnitude relationship of the reference voltage 5 V and the input corresponding to the analog voltage signal having a peak value of 150 mV, and further adjust the gain function A to approach to 100/3 and not be greater than 100/3. The physical implementation may adjust the variable resistor R2 to 31R1, so to A=32. Therefore, the amplified analog signal V3 having a voltage signal peak value of 4.8 V can be obtained. The total utilization of the analog to digital converter mentioned above can be further enhanced (the 5 V reference voltage can fully utilize 4.8 V) and the resolution of the digital signal can be also increased (the resolution can be increased by log232=5 bit, thus the performance of the 8-bit analog to digital converter can be enhanced to 13 bits).

Figure 4A:
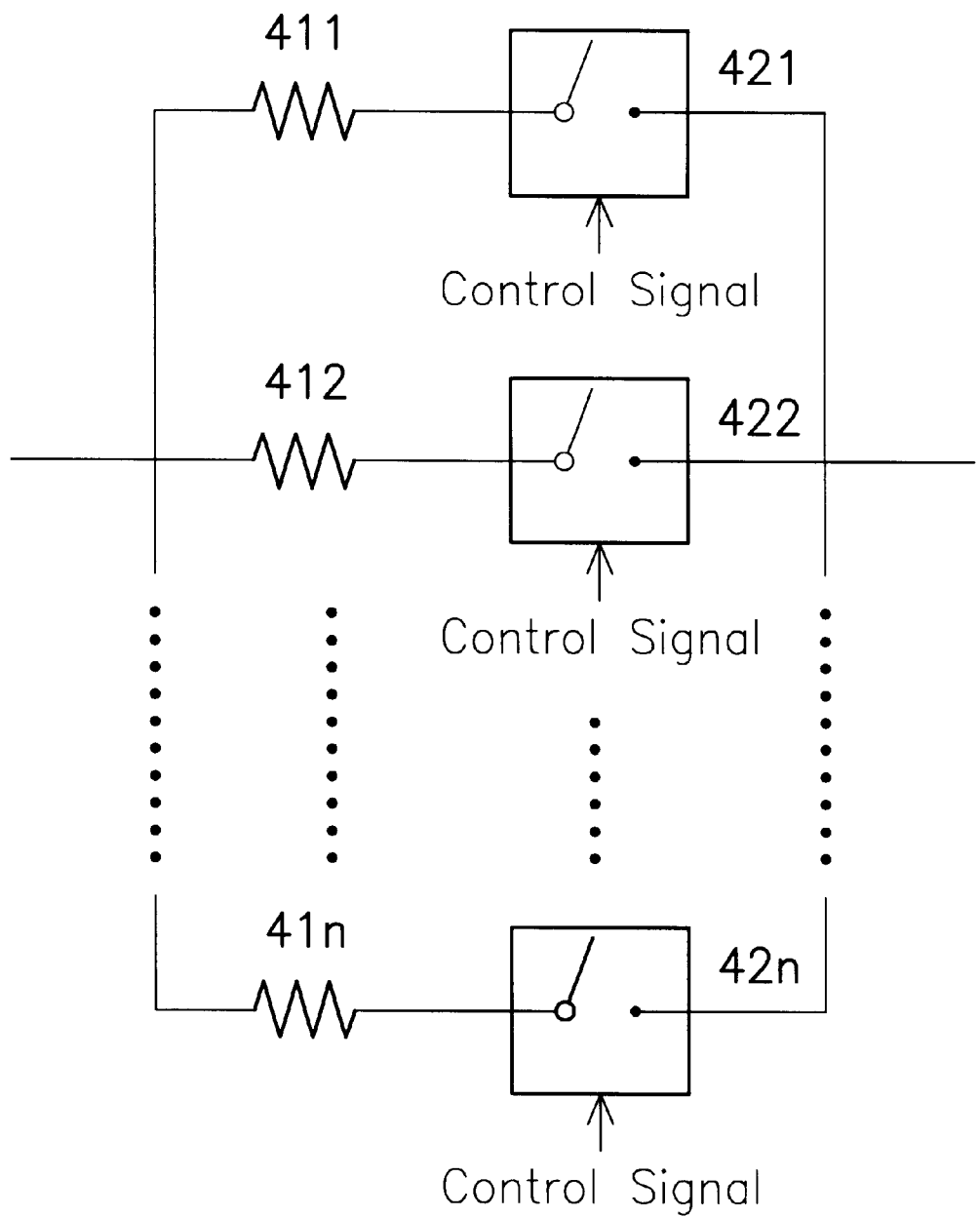
FIGS. 4(a) and 4(b) schematically shows the circuit sketch map of the variable resistor R2 of the first preferred embodiment and the second preferred embodiment.
Figure 4B:
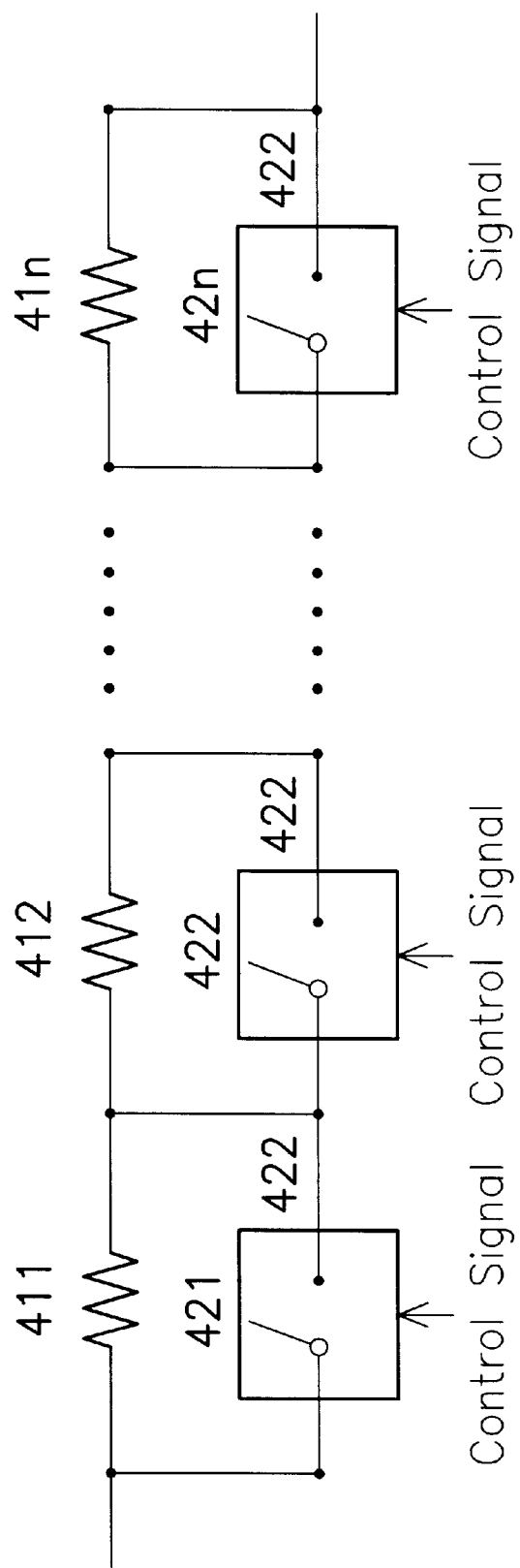

The variable resistor R2 can be implemented by using the circuits composed of the resistor 411, 412, . . . , 41n and the controlled switch 421, 422, . . . , 42n as shown in FIGS. 4(a) and 4(b). Those who are skilled in the related art can modify the variances freely, thus it will not be described pleonastically here.

Figure 5:
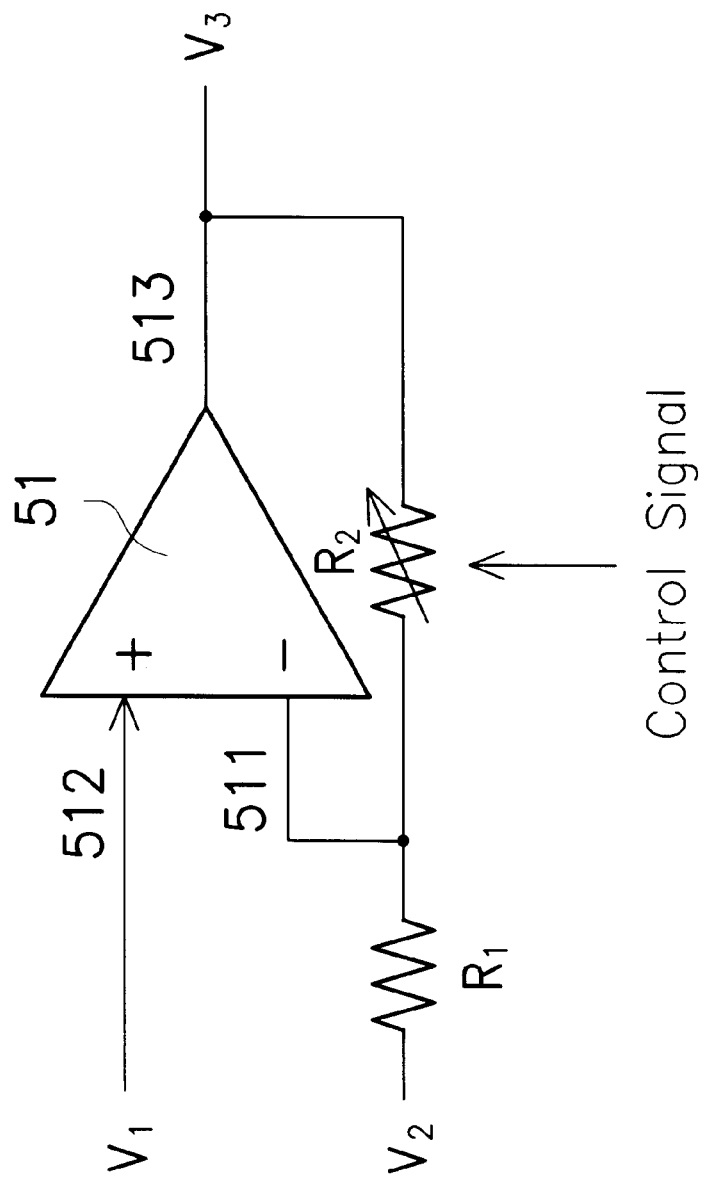
FIG. 5 schematically shows a circuit sketch map of the second preferred embodiment among the various embodiments developed for different requirements of the adjustable gain amplifier according to the present invention.

FIG. 5 schematically shows a second preferred embodiment among the various embodiments developed for different requirements of the adjustable gain amplifier 21. The adjustable gain amplifier 21 comprises an operational amplifier 51, a fixed resistor R1, and a variable resistor R2, wherein the operational amplifier 51 has an inverse phase input terminal 511, a non-inverse phase input terminal 512, and an output terminal 513. The analog voltage signal V1 mentioned above inputs into the non-inverse input terminal 512, and the output terminal 513 couples to the n-bit analog to digital converter 22. The fixed resistor R1 couples in between the reference voltage V2 and the inverse phase input terminal 511. The variable resistor R2 couples in between the inverse phase input terminal 511 and the output terminal 513. According to the circuit characteristic of the operational amplifier, a differential input amplification relationship as (V3−V2)=A(V1−V2), (A=(R1+R2)/R1) can be obtained, and can be applied in the situation that demands the high resolution effect of the voltage variance around the reference voltage V2.

Figure 6:
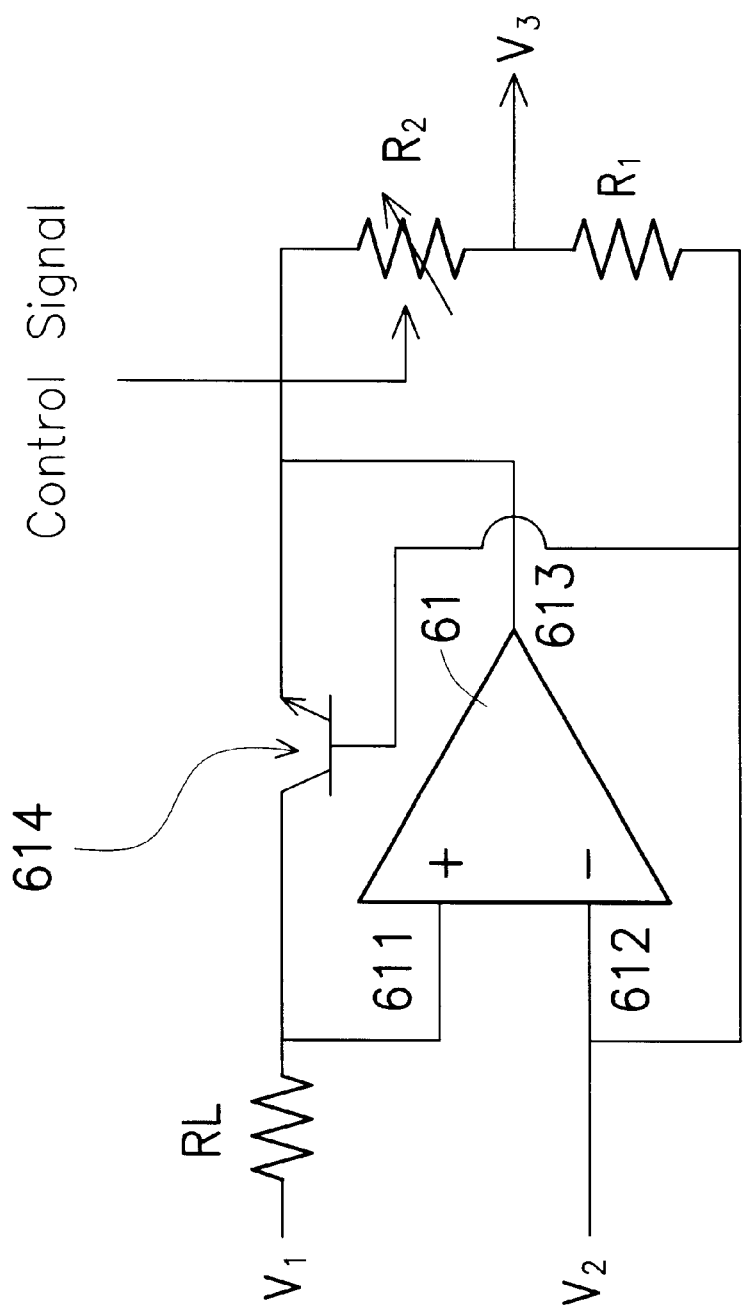
FIG. 6 schematically shows a circuit sketch map of the third preferred embodiment among the various embodiments developed for different requirements of the adjustable gain amplifier according to the present invention.

FIG. 6 schematically shows a third preferred embodiment among the various embodiments developed for different requirements of the adjustable gain amplifier 21. The adjustable gain amplifier comprises an operational amplifier 61, a load resistor RL, a npn transistor 614, a fixed resistor R1, and a variable resistor R2. The operational amplifier 61 has an inverse phase input terminal 611, a non-inverse phase input terminal 612, and an output terminal 613. The analog voltage signal V1 inputs into the inverse phase input terminal 611, and the reference voltage V2 inputs into the non-inverse phase input terminal 612. The load resistor RL electrically couples in between the analog voltage signal V1 and the inverse phase input terminal 611. The npn transistor 614 has a collector, an emitter, and a base, wherein the collector of the npn transistor 614 couples to the inverse phase input terminal 611, the emitter of the npn transistor 614 couples to the output terminal 613, and the base of the npn transistor 614 couples to the non-inverse phase input terminal 612. The fixed resistor R1 electrically couples to the non-inverse phase input terminal 612. The variable resistor R2, that is electrically coupled in between the output terminal 613 and the fixed resistor R1, and the fixed resistor R1, combined with the npn transistor are used to create the adjustable gain amplifier having a nonlinear logarithmic gain function that corresponds to the reference voltage V2. Therefore, the present invention provides a logarithmic amplifier that is different from the linear amplifier mentioned above to increase the dynamic range ratio of the analog voltage signal V1 and to extract and provide different ratios to the subsequent n-bit analog to digital converter 22 for its operation by using the method of the voltage separation.

In summary, the present invention totally resolves the defects of the low resolution caused by the poor total utilization in the prior art without having to increase the physical bit number of the analog to digital converter. Moreover, the various embodiments developed for different functions and requirements can achieve the high resolution effect of the voltage variance around the reference voltage V2, or can increase the dynamic range ratio of the analog voltage V1, so that the defects in the prior art can be totally resolved and the objective of the present invention can be achieved.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. An analog to digital conversion device, integrated in a microcontroller that is accomplished on a single chip, the device comprising:

an adjustable gain amplifier, used to obtain a corresponding analog voltage signal V1−V2 after corresponding an input analog voltage V1 to a reference voltage V2, and based on a corresponding relationship of a gain function A, performing an amplification operation to a corresponding analog voltage signal, and further outputting an amplified analog voltage signal A(V1−V2); and a n-bit analog to digital converter, having a reference voltage Vr, electrically coupling to an output of the adjustable gain amplifier, used to convert the amplified analog voltage signal into a digital voltage signal, and outputting the digital voltage signal, wherein the gain function of the adjustable gain amplifier can be provided to the microcontroller to perform an adjustment according to the reference voltage Vr and a relationship of a peak value of the corresponding input analog voltage signal, further obtaining a better digital signal resolution.

2. The analog to digital conversion device of claim 1, wherein the adjustable gain amplifier comprises:

an operational amplifier, having an inverse phase input terminal, a non-inverse phase input terminal, and an output terminal, wherein the analog voltage signal V1 inputs into the non-inverse phase input terminal, the output terminal couples to the n-bit analog to digital converter;

a fixed resistor R1, electrically coupling in between the ground where the reference voltage V2 equals 0 and the inverse phase input terminal; and a variable resistor R2, electrically coupling in between the inverse phase input terminal and the output terminal, used to create the adjustable gain amplifier having a gain function A as (R1+R2)/R1.

3. The analog to digital conversion device of claim 1, wherein the adjustable gain amplifier comprises:

an operational amplifier, having an inverse phase input terminal, a non-inverse phase input terminal, and an output terminal, wherein the analog voltage signal V1 inputs into the non-inverse phase input terminal, the output terminal couples to the n-bit analog to digital converter;

a fixed resistor R1, electrically coupling in between the reference voltage V2 and the inverse phase input terminal; and a variable resistor R2, electrically coupling in between the inverse phase input terminal and the output terminal, used to create the adjustable gain amplifier having a gain function A as (R1+R2)/R1 that corresponds to the reference voltage V2.

4. The analog to digital conversion device of claim 1, wherein the adjustable gain amplifier comprises:

an operational amplifier, having an inverse phase input terminal, a non-inverse phase input terminal, and an output terminal, wherein the analog voltage signal V1 inputs into the inverse phase input terminal, the reference voltage V2 inputs into the non-inverse phase input terminal;

a load resistor RL, electrically coupling in between the analog voltage signal V1 and the inverse phase input terminal;

a npn transistor, wherein the collector of the npn transistor couples to the inverse phase input terminal, the emitter of the npn transistor couples to the output terminal, the base of the npn transistor couples to the non-inverse phase input terminal;

a fixed resistor R1, electrically coupling to the non-inverse phase input terminal; and a variable resistor R2, electrically coupling in between the output terminal and the fixed transistor R1, used to create the adjustable gain amplifier having a logarithm gain function that corresponds to the reference voltage V2.

5. An analog to digital conversion device, integrated in a microcontroller, the device comprising:

an adjustable gain amplifier, used to obtain a corresponding analog voltage signal V1−V2 after corresponding an input analog voltage V1 to a reference voltage V2, and based on a corresponding relationship of a gain function A, performing an amplification operation to a corresponding analog voltage signal, and further outputting an amplified analog voltage signal A(V1−V2); and a n-bit analog to digital converter, having a reference voltage Vr, electrically coupling to an output of the adjustable gain amplifier, used to convert the amplified analog voltage signal into a digital voltage signal, and outputting the digital voltage signal, wherein the gain function of the adjustable gain amplifier can be provided to the microcontroller to perform an adjustment according to the reference voltage Vr and a relationship of a peak value of the input corresponding analog voltage signal, further obtaining a better digital signal resolution.

6. The analog to digital conversion device of claim 5, wherein all elements of the microcontroller are accomplished on a single chip.

7. The analog to digital conversion device of claim 5, wherein the adjustable gain amplifier comprises:

an operational amplifier, having an inverse phase input terminal, a non-inverse phase input terminal, and an output terminal, wherein the analog voltage signal V1 inputs into the non-inverse phase input terminal, the output terminal couples to the n-bit analog to digital converter;

a fixed resistor R1, electrically coupling in between the ground where the reference voltage V2 equals 0 and the inverse phase input terminal; and a variable resistor R2, electrically coupling in between the inverse phase input terminal and the output terminal, used to create the adjustable gain amplifier having a gain function A as (R1+R2)/R1.

8. The analog to digital conversion device of claim 5, wherein the adjustable gain amplifier comprises:

an operational amplifier, having an inverse phase input terminal, a non-inverse phase input terminal, and an output terminal, wherein the analog voltage signal V1 inputs into the non-inverse phase input terminal, the output terminal couples to the n-bit analog to digital converter;

a fixed resistor R1, electrically coupling in between the reference voltage V2 and the inverse phase input terminal; and a variable resistor R2, electrically coupling in between the inverse phase input terminal and the output terminal, used to create the adjustable gain amplifier having a gain function A as (R1+R2)/R1 that corresponds to the reference voltage V2.

9. The analog to digital conversion device of claim 5, wherein the adjustable gain amplifier comprises:

an operational amplifier, having an inverse phase input terminal, a non-inverse phase input terminal, and an output terminal, wherein the analog voltage signal V1 inputs into the inverse phase input terminal, the reference voltage V2 inputs into the non-inverse phase input terminal;

a load resistor RL, electrically coupling in between the analog voltage signal V1 and the inverse phase input terminal;

a npn transistor, wherein the collector of the npn transistor couples to the inverse phase input terminal, the emitter of the npn transistor couples to the output terminal, the base of the npn transistor couples to the non-inverse phase input terminal;

a fixed resistor R1, electrically coupling to the non-inverse phase input terminal; and a variable resistor R2, electrically coupling in between the output terminal and the fixed transistor R1, used to create the adjustable gain amplifier having a logarithm gain function that corresponds to the reference voltage V2.

10. An analog to digital conversion device, the device comprising:

an adjustable gain amplifier, used to obtain a corresponding analog voltage signal V1−V2 after corresponding an input analog voltage V1 to a reference voltage V2, and based on a corresponding relationship of a gain function A, performing an amplification operation to a corresponding analog voltage signal, and further outputting an amplified analog voltage signal A(V1−V2); and a n-bit analog to digital converter, having a reference voltage Vr, electrically coupling to an output of the adjustable gain amplifier, used to convert the amplified analog voltage signal into a digital voltage signal, and outputting the digital voltage signal, wherein the gain function of the adjustable gain amplifier can be provided to the microcontroller to perform an adjustment according to the reference voltage Vr and a relationship of a peak value of the input corresponding analog voltage signal, further obtaining a better digital signal resolution.

11. The analog to digital conversion device of claim 10, wherein the device is integrated in a microcontroller, the microcontroller is accomplished on a single chip.

12. The analog to digital conversion device of claim 10, wherein the adjustable gain amplifier comprises:

an operational amplifier, having an inverse phase input terminal, a non-inverse phase input terminal, and an output terminal, wherein the analog voltage signal V1 inputs into the non-inverse phase input terminal, the output terminal couples to the n-bit analog to digital converter;

a fixed resistor R1, electrically coupling in between the ground where the reference voltage V2 equals 0 and the inverse phase input terminal; and a variable resistor R2, electrically coupling in between the inverse phase input terminal and the output terminal, used to create the adjustable gain amplifier having a gain function A as (R1+R2)/R1.

13. The analog to digital conversion device of claim 10, wherein the adjustable gain amplifier comprises:

an operational amplifier, having an inverse phase input terminal, a non-inverse phase input terminal, and an output terminal, wherein the analog voltage signal V1 inputs into the non-inverse phase input terminal, the output terminal couples to the n-bit analog to digital converter;

a fixed resistor R1, electrically coupling in between the reference voltage V2 and the inverse phase input terminal; and a variable resistor R2, electrically coupling in between the inverse phase input terminal and the output terminal, used to create the adjustable gain amplifier having a gain function A as (R1+R2)/R1 that corresponds to the reference voltage V2.

14. The analog to digital conversion device of claim 10, wherein the adjustable gain amplifier comprises:

an operational amplifier, having an inverse phase input terminal, a non-inverse phase input terminal, and an output terminal, wherein the analog voltage signal V1 inputs into the inverse phase input terminal, the reference voltage V2 inputs into the non-inverse phase input terminal;

a load resistor RL, electrically coupling in between the analog voltage signal V1 and the inverse phase input terminal;

a npn transistor, wherein the collector of the npn transistor couples to the inverse phase input terminal, the emitter of the npn transistor couples to the output terminal, the base of the npn transistor couples to the non-inverse phase input terminal;

a fixed resistor R1, electrically coupling to the non-inverse phase input terminal; and a variable resistor R2, electrically coupling in between the output terminal and the fixed transistor R1, used to create the adjustable gain amplifier having a logarithm gain function that corresponds to the reference voltage V2.

* * * * *